United States Patent
Yao et al.

[11] Patent Number: 5,814,564
[45] Date of Patent: Sep. 29, 1998

[54] ETCH BACK METHOD TO PLANARIZE AN INTERLAYER HAVING A CRITICAL HDP-CVD DEPOSITION PROCESS

[75] Inventors: Liang-Gi Yao, Taipei; Ruey-Feng Rau, Miao-li; Tony Chang, Hsinchu; Bu-Chin Chung, Taipei, all of Taiwan

[73] Assignee: Vanguard International Semiconductor Corporation, Hsin-Chu, Taiwan

[21] Appl. No.: 857,164

[22] Filed: May 15, 1997

[51] Int. Cl.$^6$ ..................... H01L 21/00
[52] U.S. Cl. .............. 438/723; 438/723; 438/743; 216/38; 216/80
[58] Field of Search .................. 438/691, 692, 438/693, 697, 710, 723, 743, 734; 216/38, 67, 79, 80

[56] References Cited

U.S. PATENT DOCUMENTS

| | | | |
|---|---|---|---|
| 5,435,888 | 7/1995 | Kalinsky et al. | 216/18 |
| 5,461,010 | 10/1995 | Chen et al. | 437/228 |
| 5,494,854 | 2/1996 | Jain | 438/692 |
| 5,496,774 | 3/1996 | Pramanik et al. | 437/195 |
| 5,679,211 | 10/1997 | Huang | 438/692 |

*Primary Examiner*—William Powell
*Attorney, Agent, or Firm*—George O. Saile; Stephen B. Ackerman; William J. Stoffel

[57] ABSTRACT

The present invention provides a method of to planarize a spin-on-glass layer overlying a HDP-CVD oxide layer using a six etchback process. The process comprises: forming a spin-on-glass layer 40 over a plasma chemical vapor deposition (HDP-CVD)oxide layer 30 over spaced raised portions 20 on a semiconductor structure. The spin-on-glass and the density plasma chemical vapor deposition (HDP-CVD) oxide layer 30 are then planarized using a six etch back process comprising: Step 2, (Etch High), a CF4 gas flow of between about 88 and 108 sccm, $CHF_3$ flow between about 35 and 45 sccm, an argon flow of between about 40 and 60 sccm, at a pressure of between about 210 and 310 mtorr, at a power of between 650 and 950 watts; Step 3 (Etch Low) a CF4 gas flow of between about 10 and 20 sccm, $CHF_3$ flow between about 70 and 90 sccm, an argon flow of between about 40 and 60 sccm, at a pressure between about 210 and 310 mtorr, and at a power of between 750 and 1050 watts, and for a time between about 70 and 110 seconds; Step 4 a Sputter step; and Step 5 a Plasma $O_2$ clean step.

11 Claims, 2 Drawing Sheets

ETCH BACK METHOD TO PLANARIZE AN INTERLAYER HAVING A CRITICAL HDP-CVD DEPOSITION PROCESS

BACKGROUND OF INVENTION

1) Field of the Invention

This invention relates generally to the fabrication of a planar inter metal layer and more particularly to a method of planarizing a plasma deposited insulating layer and a spin-on-glass layer using an etchback process.

2) Description of the Prior Art

As the device scale is shrinking down, gap-filling capability becomes more important in the manufacture of advance semiconductor devices. Some new technologies such as Ozone-TEOS and HDP-CVD (high density plasma-chemical vapor deposition) processes are being used to gap fill in between very closely spaced metal lines. In particular, the HDP-CVD deposition results in a top surface topology with a pyramid shaped oxide protrusion deposited over metal lines. The pyramid shaped topography results from the simultaneous deposition and etch process inherent in the HPD-CVD process. At the pyramid corners, the HPD-CVD process has an enhanced etch rate. Due to the highly uneven topography (e.g., pyramid shapes) from the simultaneous etch/deposition process in the HDP-CVD technique, a planarization layer and a planarization step are needed to planarize the surface so that overlying metal and insulating layers can be properly formed. The planarization layer can be made of several oxide materials. These oxide materials fill in the gaps and spaces between the pyramids and other topography.

The planarization layer and the HPD-CVD layer can be planarized using an etch back process or a CMP process. Common etch back processes have problems when etching the two different materials—the planarization layer and then the HDP-CVD (or PECVD) layer. The conventional etch back processes do not evenly etch both layers and result in an uneven surface. Current etchback process can't create a sufficiently even surface, especially with the requirements of the new technology devices. As a result of the inadequate etchback processes, semiconductor manufactures have turned to using chemical-mechanical polish (CMP) processes.

Conventional Chemical-mechanical polish (CMP) planarization processing of both the planarization layer and the HPD-CVD layer also has several drawbacks. First, a thicker sacrificial PECVD film (approximately 2 $\mu$m) is usually needed for the chemical-mechanical polish process. This adds additional cost. Also, the CMP process requires extensive post-CMP cleaning processes that also add costs and time.

Others have striven to provide better planarization techniques. For example, U.S. Pat. No. 5,461,010 (Chen et al.) teaches a two step etch back of a barrier layer under a SOG layer. U.S. Pat. No. 5,496,774 (Pramanik et al.) shows a planarization etchback technique using a nitride and SOG layer. U.S. Pat. No. 5,435,888 (Kalnitsky) shows a planarization process using a three layer structure and etch back of SOG-oxide-SOG.

However, there still exists a need for an improved etch back planarization process SOG and a HPD-CVD interlayers that provides an even planar surface. The method must be economical, and not require extensive post planarization cleaning. The method should not require the use of thick sacrificial layers.

SUMMARY OF THE INVENTION

It is an object of the present invention to provide a method to planarize a HDP-CVD oxide interlayer.

It is an object of the present invention to provide a method to planarize a SOG layer overlying a HDP-CVD oxide layer using two steps of a six step etch back process.

To accomplish the above objectives, the present invention provides an etchback method to planarize a SOG layer and HDP-CVD oxide interlayer using a six step etchback process.

The etch back process has two steps (a high and low etch-back) for the selective etch back of SOG and HDP-CVD (PECVD films). The chemicals, chemical rations, power and etchback time are all critical/important parameters in this method. The process of the present invention comprising the steps of:

a) forming spaced raised portions 20 over a semiconductor structure;

b) forming a plasma chemical vapor deposition (HDP-CVD or PECVD) layer 30 preferably composed of oxide over the spaced raised portions 20;

c) forming a spin-on-glass layer 40 over the density plasma chemical vapor deposition (HDP-CVD) layer 30;

d) planarizing the spin-on-glass and the density plasma chemical vapor deposition (HDP-CVD) layer 30 using an etch back process comprising the following six steps;

e) Step 1 (Stabilization) a $CF_4$ gas flow of between 88 and 108 sccm (98±10), $CHF_3$ flow between about 35 and 45 sccm, an argon flow of between about 40 and 60 sccm (50±10), at a pressure of between about 210 and 310 mtorr (260±50), at a power of about 0 watts, and for a time between about 5 and 25 seconds (15±10);

f) Step 2, (Etch High), a CF4 gas flow of between about 88 and 108 sccm (98±10), $CHF_3$ flow between about 35 and 45 sccm, an argon flow of between about 40 and 60 sccm (50±10), at a pressure of between about 210 and 310 mtorr (260±50), at a power of between 650 and 950 watts (800±150), and for a time between about 55 and 95 seconds (75±20);

g) Step 3 (Etch Low) a CF4 gas flow of between about 10 and 20 sccm (15±5), $CHF_3$ flow between about 70 and 90 sccm (80±10), an argon flow of between about 40 and 60 sccm (50±10), at a pressure between about 210 and 310 mtorr (260±50), and at a power of between 750 and 1050 watts (900±150), and for a time between about 70 and 110 seconds (90±20).

h) Step 4 (Sputter) an Ar gas flow of between about 40 and 60 sccm (50±10), at a pressure between about 40 and 60 mtorr (50±10) at a power between 800 and 900 watts (850±50) and for a time between 3 and 8 seconds (5±2);

i) Step 5 (Plasma) an $O_2$ gas flow of between about 250 and 350 sccm (300±50), at a pressure between about 350 and 450 mtorr (400±50), at a power of between about 200 and 300 watts (250±50), and for a time between about 5 and 11 seconds;

j) Step 6 (Pump) an $O_2$ gas flow of between about 250 and 350 sccm (300±50), Throttle fully open, at a power between about 90 and 110 watts, and for a time between about 4 and 8 seconds.

The planarization process of the present invention provides an etchback process that provide a more even planar surface possible using conventional etch back processes.

The planarization process is highly tailored to the SOG and HDP-CVD layers. The specific chemicals, chemical ratios, power, etc. and etch back times are critical in this process. The combination of the 2nd, 3rd, 4th and 5th steps provides an unexpected improvement in the planarization (flatness/levelness) that can not be attributed to the optimization of set of process variables. In addition, the 2nd and 3rd etch steps provide an even surface etch even though the composition of the etched surface is changes as the HDP-CVD layer (pyramid) is etched with the SOG layer.

In addition, the etchback process provides a very planar surface without the disadvantages of the chemical-mechanical polish process, such as the post chemical-mechanical polish (CMP) cleaning procedures. The method also eliminates spin-on-glass residues. The process allows the use of much thinner sacrificial layers. The invention also reduces cost by eliminating the need to purchase expensive chemical-mechanical polish machines to perform the planarization step. This reduces the extra incremental investment in chemical-mechanical polish machines.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method to planarize a SOG layer and HDP-CVD oxide interlayer using largely two steps (steps (2) (etch high) and (3) (low etch)) of a six step etchback process. It is important to note that the parameters (e.g., gas flow rates) in the invention (e.g., in the table 1 below) can be scaled up or down for different reactors by using the proper proportions/percentages.

The method begins by forming spaced raised portions 20 over a semiconductor structure. See FIG. 1. The semiconductor structure can include semiconductor devices, such as field effect transistors (FETs), source/drain regions, word lines etc., and overlaying insulating layers and conductive (e.g., metal) layers, etc. These devices and layers are formed in and over a semiconductor substrate. Devices can be formed within the substrate, such as source, drains, insulating regions. The raised portions 20 can represent conductive (e.g., metal or metal alloy) lines. The raised portions are preferably composed of a metal or polysilicon having a height 20A in a range of between about 0.2 and 1.2 $\mu$m and a spacing 20B in a range of between about 0.1 and 2.0 $\mu$m. The raised portions 20 can represent metal lines or landing pads.

Figure 1:
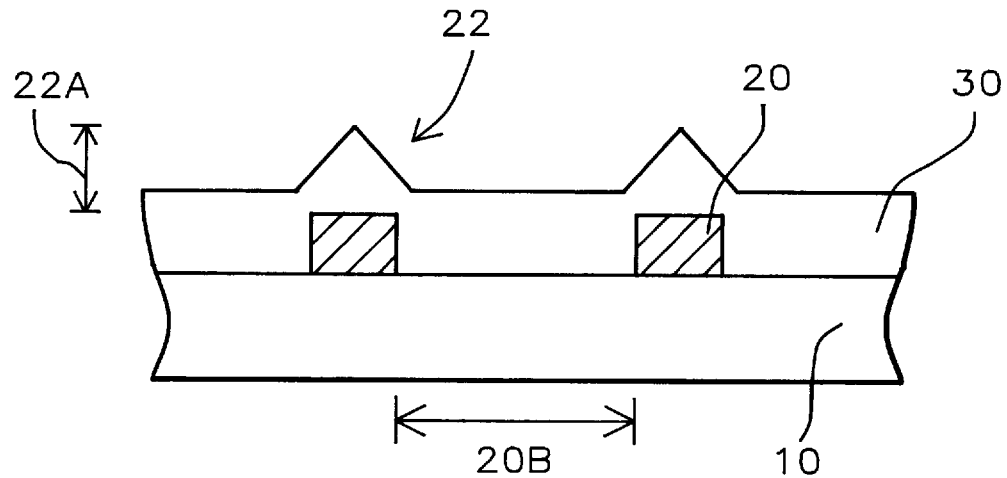
FIGS. 1 through 3 are cross sectional views for illustrating a method for planarizing an interlayer using the etchback process according to the present invention.
Figure 2:
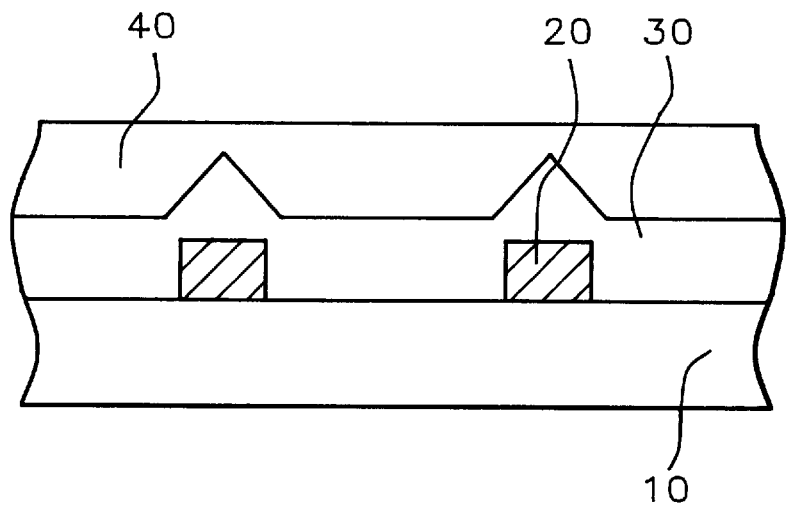

Next, as shown in FIG. 1, a plasma chemical vapor deposition layer 30 is formed over the spaced raised portions 20. The plasma chemical vapor deposition (HDP-CVD) layer is preferably composed of silicon oxide, oxynitride, silicon nitride or Fluorine doped $SiO_2$ and is more preferably composed of silicon oxide. The plasma chemical vapor deposition layer 30 is preferably formed using a high density plasma chemical vapor deposition (HDP-CVD) process or a PECVD process and is more preferably formed using a HDP-CVD process.

The high density plasma chemical vapor deposition layer 30 composed of oxide can be formed by reacting $SiH_4$ and argon and $O_2$ at a pressure in a range of between about 260±50 mtorr for etching and sputtering and 400±50 mtorr for $O_2$ plasma and a temperature in a range of between about 200° and 450° C. The HDP chemical vapor deposition oxide layer 30 preferably has a thickness in a range of between about 4000 and 12,000 Å. The plasma chemical vapor deposition oxide layer 30 forms a pyramid protrusion (e.g., projection, mount, hill) 22 has a thickness 22A (see FIG. 1) above the top surface of the spaced raised portion in a range of between about 4000 and 12,000 Å as shown FIG. 1. This pyramid shaped protrusion 22 is the result of the HDP-CVD process. This Pyramid shaped deposition 22 dramatically changes the etch back process requirements since the HPD-CVD layer 30 is exposed/etched while parts of the SOG layer 40 are also etched. The etching of the two materials creates enhanced etching and uneven surfaces in the conventional etchback processes.

A spin-on-glass layer (SOG) 40 is preferably formed over the density plasma chemical vapor deposition (HDP-CVD) layer 30. The SOG layer 30 preferably has a thickness between about in a range of between about 2000 and 7000 Å.

The SOG layer 40 can be formed by the deposition of one or more coating step series. Each of these coating steps include the coating deposition step of a silicate or siloxane type spin-on-glass material in a vehicle by spinning the wafer to which it has been applied. Examples of the silicate type is Allied signal 211 and siloxane type is Allied Signal 314. After each coating, the wafer is baked at a temperature of less than about 350 degrees °C. for about 2 to 10 minutes to drive off the solvent or vehicle from the coating. The third step in the sequence for each coating is flowing in $N_2$ for 1 hr to 3 hours. This step is performed by placing the wafer in a $N_2$ flow at about 435° C. for at least about 20 minutes. The $N_2$ flow removes all residual solvents and other chemicals that could in later processing cause cracking and corrosion of metal or polysilicon layers.

The three spin-on-glass processing steps, (spin-on-glass deposition, baking and/or $N_2$ flowing) are repeated for each of the one or more coatings until the desired thickness of layer 40 is obtained.

Figure 4:
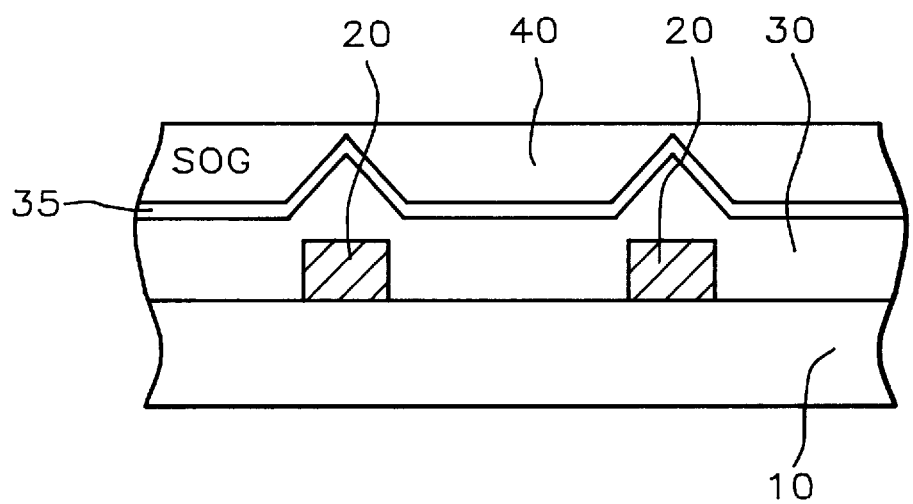
FIG. 4 is a cross sectional view for illustrating a method for planarizing an interlayer including a sacrificial layer 35 using an etchback process according to the present invention.

As shown in FIG. 4, an optional sacrificial layer 35 can be formed over the plasma chemical vapor deposition layer 30. The sacrificial layer 35 is preferably composed of PECVD oxide, $O_3$-TEOS, PE-TEOS or PE-$SiH_4$ and more preferably of PETEOS, and preferably has a thickness between 0 and 8000 Å. The thinner the sacrificial layer 35 the higher the throughput for both the oxide deposition and planarization.

The thicker the HDP-CVD layer 30 is, the thinner the sacrificial layer 35 is required. However, the thicker the HDP layer, the higher the process cost (throughput and investment).

Figure 3:
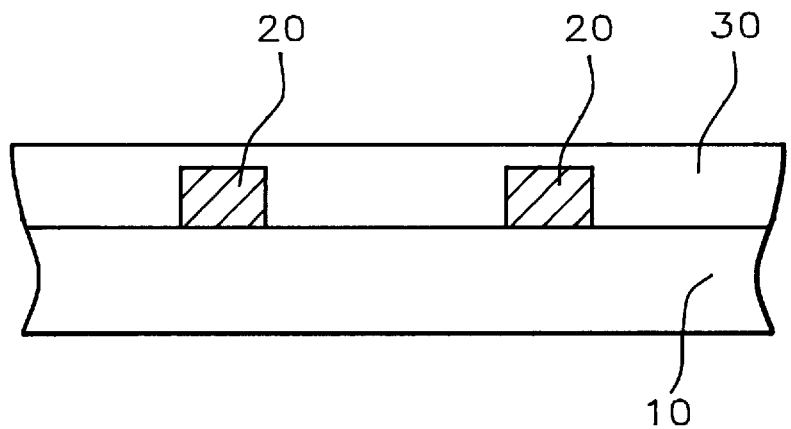

In an important process step, the spin-on-glass layer 40, the optional sacrificial layer 35 (if present) and the plasma chemical vapor deposition layer 40 are planarized (See FIG. 3) using the invention's novel etch back process comprising six steps.

Below is a description of the six step etch process of an insulating layer 30 composed of silicon oxide (HPD-CVD) and a SOG layer 40. The precise etch parameters are critical for the proper planarization of the layer. Also, see table 1 below for a summary of the preferred etch back parameters for the SOG/HPD-CVD oxide layers 30 40.

Step 1 is a stabilization step performed at a $CF_4$ gas flow of between 88 and 108 sccm (98±10), a $CHF_3$ flow of between about 35 and 45 sccm (40±5), an argon flow of between about 40 and 60 sccm (50±10), at a pressure of between about 210 and 310 mtorr (260±50), at a power of about 0 watts, and for a time between about 5 and 25 seconds (15±10).

Step 2 is a Etch High step performed at a CF4 gas flow of between about 88 and 108 sccm (98±10), a $CHF_3$ flow of between about 35 and 45 sccm (40±5), an argon flow of between about 40 and 60 sccm (50±10), at a pressure of between about 210 and 310 mtorr (260±50), at a power of between 650 and 950 watts (800±150), and for a time between about 55 and 95 seconds (75±20).

The step 2 high etch etches all the SOG layer 40, but stops at the interface to the sacrificial layer 35 (if present). For the high etch, the etch ratio between SOG to PETESO (or HDP-CVD) is 1.0:0.9 and 1.0:1.9 (1.0 to 1.4±0.5). The etch time of the step 2, (etch-high) is dependent on the topography of the deposited HPD-CVD layer on metal or poly lines. The thicker the step height is, the longer the etching time (for etching-high and etch-low). The high etch removes most of the SOG. The preferred etch times are shown in table 1 for the thickness and composition of layers 30 40 described above.

Step 3 is a Etch Low step performed at a $CF_4$ gas flow of between about 10 and 20 sccm (15±5), a $CHF_3$ flow of between about 70 and 90 sccm (80±10), an argon flow of between about 40 and 60 sccm (50±10), at a pressure between about 210 and 310 mtorr (260±50), and at a power of between 750 and 1050 watts (900±150), and for a time between about 70 and 110 seconds (90±20).

For the low etch step, the etch ratio between SOG to PETEOS (or HDP-CVD) is between 1:0.10 and 1:0.40 (1:0.25±0.15). The etch-low step is mainly etches the extruded oxide off (e.g., the PETESO (or HDP-CVD) layer 30 and sacrificial layer 35). The optimum balance of etch-high and etch-low time will get the best planarization.

Step 4 of the process is a Sputter step comprising an Ar gas flow of between about 45 and 55 sccm (40±5), at a power between 800 and 900 watts (850±50) and for a time between 3 and 8 seconds (5±2).

The sputter step treats the surface of the etched layer 30 35 to remove any polymer on the surface. The sputter step eliminates post cleaning steps (required by the conventional etchback and CMP processes thereby reducing costs.

Step 5 of the etch is the Plasma step which comprises an $O_2$ gas flow of between about 250 and 350 sccm (300±50), at a pressure between about 350 and 450 mtorr (400±50), at a power of between about 200 and 300 watts (250±50), and for a time between about 5 and 11 seconds. The plasma step removes any remaining SOG residue and polymer left from the previous step. The plasma step eliminates post cleaning steps (required by the conventional etchback and CMP processes thereby further reducing costs.

Step 6 of the process is a pump step comprising an $O_2$ gas flow of between about 250 and 350 sccm (300±50), and at a pressure between about 10 and 50 mtorr, (Throttle fully open) at a power between about 90 and 110 watts, and for a time between about 4 and 8 seconds. The pump step evacuates the gasses from the etcher.

The a summary of the etch back process of the invention is shown is table 1 below:

TABLE 1

The Invention's SOG: HDP-CVD etchback recipe

| Variables | Step 1 Stabilization | Step 2 Etch High | Step 3 Etch Low | Step 4 Sputter | Step 5 Plasma | Step 6 Pump |
|---|---|---|---|---|---|---|
| Gas (sccm) | $CF_4$: 98 +/−10; $CHF_3$ 40 +/− 5; Ar 50 +/− 10 | $CF_4$: 98 +/− 10; CHF3 40 +/− 5; Ar 50 +/− 10 | $CF_4$:15 +/− 5; $CHF_3$ 80 +/− 10; Ar 50+/−10 | Ar 50 +/− 10 | $O_2$:300 +/− 50 | $O_2$:300 +/− 50 |
| Pressure (mTorr) | 260 +/− 50 | 260 +/− 50 | 260 +/− 50 | 260 +/− 50 | 400 +/− 50 | Throttle fully open (10 to 50 mtorr) |
| Power (W) | 0 | 800 +/− 150 | 900 +/− 150 | 850 +/− 50 | 250 +/− 50 | 100 +/− 10 |
| Time (sec) | 15 +/− 10 | 75 +/− 20 | 90 +/− 20 | 5 +/− 2 | 8 +/− 3 | 6 +/− 2 |
| Action |  | Selectively remove SOG (1:1.1 to 1:1.9) | selectively remove HPD-CVD layer (1:0.10 to 1:0.4) | surface treatment to remove polymer layer | surface treatment to remove SOG residues | evacuate chamber and contamination. |

The six step etch back process of the invention is preferably performed in a P5000 model etcher, by Applied Materials company at Santa Clara, Calif. USA. or a Centrura. It is important to note that the parameters in the invention (e.g., in the table above) can be scaled up or down for different reactors/configurations by using the proper proportions/percentages (e.g., gas flow rates can be scaled by keeping the % gas constant).

The planarization process of the present invention provides an etchback process that eliminates spin-on-glass residues. The planarization process is highly tailored to the SOG and HDP-CVD layers. The specific chemicals, chemical ratios, power etch back times and other parameters times are critical in this etch back planarization process. The combination of the 2nd, 3rd, 4th and 4th steps provides an unexpected improvement in the planarization (flatness/levelness) that can not be attributed to the optimization of one or the set of variables. In addition, the 2nd and 3rd etch steps provide an even surface etch even though the composition of the etched surface is changes as the HDP-CVD layer (pyramid) is etched with the SOG layer. As shown FIG. 1, this pyramid shaped deposition is the result of the HDP-CVD process. This Pyramid shaped deposition dramatically changes the etch back process requirements since the HPD-CVD layer is exposed/etched at during part of the SOG layer is also etched. The etching of the two materials creates enhanced etching and uneven surfaces in the conventional etchback processes. However, the high low step etch back of the present invention evenly etches both layers during this transition. This allows the etchback of the present invention to provide a superior even resulting layer compared to the prior art etch back processes.

The process allows the use of much thinner sacrificial layers. In addition, the etchback process provides a very planar surface without the disadvantages of the chemical-mechanical polish process, such as the post chemical-mechanical polish (CMP) cleaning procedures.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a planarized oxide layer over a semiconductor structure having raised portions; comprising the steps of:
    a) forming spaced raised portions over a semiconductor structure;
    b) forming a plasma chemical vapor deposition layer over said spaced raised portions;
    c) forming a spin-on-glass layer over said plasma chemical vapor deposition oxide layer;
    d) planarizing said spin-on-glass and said plasma chemical vapor deposition layer using an etch back process comprising six steps:
    e) performing Step 1 at a $CF_4$ gas flow of between 88 and 108 sccm, a $CHF_3$ flow of between about 35 and 45 sccm, an argon flow of between about 40 and 60 sccm, at a pressure of between about 210 and 310 mtorr, at a power of about 0 watts, and for a time between about 5 and 25 seconds;
    f) performing Step 2 at a $CF_4$ gas flow of between about 88 and 108 sccm, a $CHF_3$ flow of between about 35 and 45 sccm, an argon flow of between about 40 and 60 sccm, at a pressure of between about 210 and 310 mtorr, at a power of between 650 and 950 watts, and for a time between about 55 and 95 seconds;
    g) performing Step 3 at a CF4 gas flow of between about 10 and 20 sccm, a $CHF_3$ flow of between about 70 and 90 sccm, an argon flow of between about 40 and 60 sccm, at a pressure between about 210 and 310 mtorr, and at a power of between 750 and 1050 watts, and for a time between about 70 and 110 seconds;
    h) performing Step 4 at an Ar gas flow of between about 40 and 60 sccm, at a pressure between about 40 and 60 mtorr, at a power between 800 and 900 watts and for a time between 3 and 8 seconds;
    i) performing Step 5 at an $O_2$ gas flow of between about 250 and 350 sccm, at a pressure of between 350 and 450 mtorr, at a power between about 200 and 300 watts, and for a time between about 5 and 11 seconds; and
    j) performing Step 6 at an $O_2$ gas flow of between about 250 and 350 sccm, at pressure between about 10 and 50 mtorr, at a power between about 90 and 110 watts, and for a time between about 4 and 8 seconds.

2. The method of claim 1 wherein said raised portions are composed of a material selected from the group consisting of metal and polysilicon, and have a height in a range of between about 0.2 and 1.2 μm and a spacing in a range of between about 0.1 and 2.0 μm.

3. The method of claim 1 wherein said plasma chemical vapor deposition layer is composed of oxide formed by reacting $SiH_4$ and argon an $O_2$ at a pressure in a range of between about 210 and 310 mtorr for etching/sputtering and treating with an $O_2$ plasma at a pressure between 350 and 450 mtorr and at a temperature in a range of between about 200° and 450° C., and said plasma chemical vapor deposition oxide layer having a thickness in a range of between about 4000 and 12,000 Å.

4. The method of claim 1 wherein said plasma chemical vapor deposition oxide layer having a thickness above the top surface of said spaced raised portion in a range of between about 4000 and 12,000 Å.

5. The method of claim 1 wherein said SOG layer having a thickness between about 1000 and 7000 Å and said spin-on-glass layer formed of a material selected from the group consisting of a silicate and siloxane.

6. The method of claim 1 which further includes forming a sacrificial layercomposed of silicon oxide over said plasma chemical vapor deposition layer, said sacrificial layer having a thickness in a range of between about 100 and 8000 Å, and the six step etch removes the sacrificial layer.

7. A method of fabrication a planarized plasma chemical vapor deposition oxide layer over a semiconductor structure having raised portions; comprising the steps of:
    a) providing a semiconductor structure having semiconductor devices forming in and on said substrate;
    b) forming spaced raised portions over said semiconductor structure;
    c) forming a plasma chemical vapor deposition oxide layer over said spaced raised portions; said plasma chemical vapor deposition oxide layer forming a pyramid protrusion having a height between about 4000 and 12,000 Å over said spaced raised portions, said plasma chemical vapor deposition oxide layer formed using a HDP-CVD process and said plasma chemical vapor deposition layer is composed of oxide formed by reacting $SiH_4$ and argon an $O_2$ at a pressure in a range of between about 210 and 310 mtorr for etching/sputtering and treating with an $O_2$ plasma at a pressure between 350 and 450 mtorr and at a temperature in a range of between about 200° and 450° C., and said plasma chemical vapor deposition oxide layer 30 having a thickness in a range of between about 4000 and 12,000 Å;

d) forming a spin-on-glass layer over said plasma chemical vapor deposition oxide layer; said spin-on-glass layer having a thickness in a range of between about 1000 and 7000 Å;

e) planarizing said spin-on-glass and said plasma chemical vapor deposition oxide layer using an etch back process comprising six steps:

f) performing Step 1 at a $CF_4$ gas flow of between 88 and 108 sccm, a $CHF_3$ flow of between about 35 and 45 sccm, an argon flow of between about 40 and 60 sccm, at a pressure of between about 210 and 310 mtorr, at a power of about 0 watts, and for a time between about 5 and 25 seconds;

g) performing Step 2 at a $CF_4$ gas flow of between about 88 and 108 sccm, a $CHF_3$ flow of between about 35 and 45 sccm, an argon flow of between about 40 and 60 sccm, at a pressure of between about 210 and 310 mtorr, at a power of between 650 and 950 watts, and for a time between about 55 and 95 seconds; and step 2 selectively etching said spin-on-glass layer at an etch ratio of between about 1:1.1 and 1:1.9 between said spin-on-glass layer and said plasma chemical vapor deposition oxide layer;

h) performing Step 3 at a CF4 gas flow of between about 10 and 20 sccm, a $CHF_3$ flow of between about 70 and 90 sccm, an argon flow of between about 40 and 60 sccm, at a pressure between about 210 and 310 mtorr, and at a power of between 750 and 1050 watts, and for a time between about 70 and 110 seconds; and step 3 having an etch ratio of between about 1:0.10 to 1:0.4 between said spin-on-glass layer and said plasma chemical vapor deposition oxide layer; said step 3 forming a polymer layer over said plasma chemical vapor deposition oxide layer;

i) performing Step 4 at an Ar gas flow of between about 40 and 60 sccm, at a pressure between about 40 and 60 mtorr, at a power between 800 and 900 watts and for a time between 3 and 8 seconds; and said step 4 removing said polymer layer;

j) said performing Step 5 at an $O_2$ gas flow of between about 250 and 350 sccm, at a pressure of between 350 and 450 mtorr, at a power of between about 200 and 300 watts, and for a time between about 5 and 11 seconds;

k) performing Step 6 at an $O_2$ gas flow of between about 250 and 350 sccm, at a pressure between 10 and 50 mtorr, at a power between about 90 and 110 watts, and for a time between about 4 and 8 seconds.

8. The method of claim 7 wherein said raised portions composed of a material selected from the group consisting of metal and polysilicon, and has a height in a range of between about 0.2 and 1.2 μm and a spacing in a range of between about 0.1 and 2.0 μm.

9. The method of claim 7 wherein said plasma chemical vapor deposition oxide layer having a thickness above the top surface of said spaced raised portion in a range of between about 4000 and 12,000 Å.

10. The method of claim 7 wherein said spin-on-glass layer formed of a material selected from the group consisting of a silicate and siloxane type material.

11. The method of claim 7 which further includes forming a sacrificial layer composed of silicon oxide over said plasma chemical vapor deposition layer, said sacrificial layer thickness in a range of between about 100 and 8000 Å, and the six step etch removes the sacrificial layer.

* * * * *